United States Patent
Kim et al.

(10) Patent No.: US 8,787,050 B2
(45) Date of Patent: Jul. 22, 2014

(54) CIRCUIT CONNECTION CONTROL SYSTEM OF FUEL CELL AND METHOD OF OPERATING THE SAME

(75) Inventors: Young-Jae Kim, Yongin-si (KR); Dong-kee Sohn, Yongin-si (KR); Hye-jung Cho, Yongin-si (KR); Joon-hee Kim, Yongin-si (KR); Jae-yong Lee, Yongin-si (KR); Jin-ho Kim, Yongin-si (KR)

(73) Assignee: Samsung SDI Co., Ltd., Suwon-si, Gyeonggi-do (KR)

( * ) Notice: Subject to any disclaimer, the term of this patent is extended or adjusted under 35 U.S.C. 154(b) by 1495 days.

(21) Appl. No.: 11/715,842

(22) Filed: Mar. 9, 2007

(65) Prior Publication Data

US 2007/0268727 A1    Nov. 22, 2007

(30) Foreign Application Priority Data

May 16, 2006  (KR) .................................. 2006-43939

(51) Int. Cl.
*H02M 1/00* (2006.01)
*H01M 8/04* (2006.01)

(52) U.S. Cl.
USPC ........................................... 363/78; 429/428

(58) Field of Classification Search
USPC ................................................. 429/428–432
See application file for complete search history.

(56) References Cited

U.S. PATENT DOCUMENTS

| 2003/0180594 | A1 | 9/2003 | Choi et al. |
| 2003/0198853 | A1 | 10/2003 | Choi et al. |
| 2004/0033398 | A1* | 2/2004 | Kearl et al. ............... 429/22 |
| 2004/0247964 | A1* | 12/2004 | Sadamoto et al. ......... 429/23 |
| 2005/0194929 | A1 | 9/2005 | Funabashi et al. |
| 2006/0057447 | A1 | 3/2006 | Yamase et al. |

FOREIGN PATENT DOCUMENTS

| CN | 1348544 A | 5/2002 |
| CN | 1551391 | 12/2004 |
| CN | 1765028 | 4/2006 |
| JP | 2006-114481 A | 4/2006 |
| WO | WO 2004/079853 | 9/2004 |
| WO | WO 2007/103104 A2 | 9/2007 |

OTHER PUBLICATIONS

Certificate of Patent No. ZL200710001434 issued in the corresponding Chinese application by the Chinese Intellectual Property Office on Aug. 12, 2009 (including Chinese application No. 100527505C).
Office Action issued by the Chinese Patent Office on Aug. 29, 2008.
Japanese Office Action in JP 2007-105174, dated Dec. 14, 2010 (Kim, et al.).

* cited by examiner

*Primary Examiner* — Barbara Gilliam
*Assistant Examiner* — Steven Scully
(74) *Attorney, Agent, or Firm* — Lee & Morse, P.C.

(57) ABSTRACT

A circuit connection control system of a fuel cell includes a point connection portion to which an anode current collecting portion and a cathode current collecting portion of each unit cell are electrically connected, a voltage measuring unit that measures an output voltage of each unit cell, a switching unit connecting the anode current collecting portions and the cathode current collecting portions of the plurality of unit cells at the point connection portion; and a DC-DC converter that converts a voltage generated from the fuel cell to a predetermined voltage. A method of operating the circuit connection control system includes measuring an output voltage of each unit cell; detecting a first unit cell showing an output voltage lower than a predetermined first voltage; and connecting the first unit cell in parallel to a second unit cell.

20 Claims, 11 Drawing Sheets

CIRCUIT CONNECTION CONTROL SYSTEM OF FUEL CELL AND METHOD OF OPERATING THE SAME

CROSS-REFERENCE TO RELATED APPLICATIONS

This application claims the benefit of Korean Application No. 2006-43939, filed on May 16, 2006, in the Korean Intellectual Property Office, the disclosure of which is incorporated herein by reference.

BACKGROUND OF THE INVENTION

1. Field of the Invention

Aspects of the present invention relate to a circuit connection control system of a fuel cell and a method of operating the same, and more particularly, to a circuit connection control system that facilitates electrical connection between cells and a method of operating the same.

2. Description of the Related Art

In a monopolar type fuel cell, a plurality of cells are formed on an electrolyte membrane, with a plurality of anodes on one side of the electrolyte membrane and a plurality of cathode electrodes on the other side of the electrolyte membrane, and with the cells connected in series. A structure for connecting anode electrodes on a first surface of the electrolyte membrane and cathode electrodes of a second surface of an electrolyte membrane was disclosed in U. S. Patent Publication Nos. 2003/0180594 and 2003/0198853. The connection structure describes therein effectively connects current collectors in series. However, when one of the cells is damaged, the performance of the whole fuel cell may be reduced.

Generally, in a monopolar type fuel cell stack, conductive plates (separators) make a serial connection between unit cells. However, when the performance of a unit cell is reduced, it is difficult to remove or replace the unit cell.

U.S. Patent Publication No. 2004/0247964 describes an element for detecting a voltage of a unit cell by connecting to unit cells of a fuel cell and an element for bypassing a unit cell that performs at a reduced level. However, as described more fully herein, merely by-passing an underperforming cell reduces the total current density of the fuel cell. In contrast, as described more fully herein, the power density of a fuel cell can be improved by connecting an underperforming unit cell in parallel to adjacent normal unit cells. Therefore, there is a need for a circuit connection control system that can connect a unit cell performing at a reduced level in parallel to normal adjacent unit cells.

SUMMARY OF THE INVENTION

Aspects of the present invention provide a circuit connection control system of a fuel cell that facilitates easy connection between a plurality of unit cells and has an element to connect a unit cell performing at a reduced level in parallel to normal adjacent unit cells of a fuel cell or to bypass the unit cell performing at a reduced level from other unit cells and a method of operating the same.

According to an aspect of the present invention, there is provided a circuit connection control system of a fuel cell having a plurality of unit cells, comprising: a point connection portion to which an anode current collecting portion and a cathode current collecting portion of each unit cell are electrically connected; a voltage measuring unit that measures an output voltage of each unit cell; a switching unit connecting the anode current collecting portions and the cathode current collecting portions of the plurality of unit cells at the point connection portion; and a DC-DC converter that converts a voltage generated from the fuel cell to a predetermined voltage.

According to aspects of the present invention, the switching unit may comprise: a plurality of main switches installed at an inlet end of each unit cell; a plurality of series connecting switches that connect an outlet end of one unit cell of the plurality of unit cells and an inlet end of another unit cell of the plurality of unit cells; a plurality of by-pass switches that each connect an inlet end of one unit cell of the plurality of unit cells and an inlet end of another unit cell of the plurality of unit cells; and a plurality of parallel connecting switches that connect an outlet end of one unit cell of the plurality of unit cells and an outlet end of another unit cell of the plurality of unit cells.

The switching unit may connect a first unit cell and a second unit cell in parallel by closing the main switches of the first and second unit cells, the by-pass switch and the parallel connecting switch between the first and second unit cells, and by opening the series connecting switch between the first and second unit cells.

Also, the switching unit may electrically separate a first unit cell from another unit cell a second cell by opening the main switch of the first unit cell, the series connecting switch and a parallel connecting switch between the first and second unit cells, and by connecting the by-pass switch between the first and second unit cells.

The circuit connection control system may further comprise a control portion that connects a first unit cell showing a voltage lower than a predetermined first voltage to a second unit cell, and electrically separates the first unit cell from other unit cells when the voltage of the first unit cell is lower than a predetermined second voltage that is lower than the first voltage.

The DC-DC converter may be connected to the switches of the switching unit to supply a voltage to operate the switches.

According to another aspect of the present invention, there is provided a fuel cell comprising: a plurality of unit cells; and a circuit connection control system, wherein the circuit connection control system comprises: a point connection portion to which an anode current collecting portion and a cathode current collecting portion of each unit cell are electrically connected; a voltage measuring unit that measures an output voltage of each unit cell; a switching unit connecting the anode current collecting portions and the cathode current collecting portions of the plurality of cells at the point connection portion; and a DC-DC converter that converts a voltage generated from the fuel cell to a predetermined voltage According to another aspect of the present invention, there is provided a method of operating a circuit connection control system of a fuel cell having a plurality of unit cells, comprising: measuring an output voltage of each unit cell; and if a first unit cell showing an output voltage lower than a predetermined first voltage is detected in the measuring, connecting the first unit cell in parallel to a second unit cell.

According to an aspect of the present invention, the first voltage may be 10 to 30% of an open circuit voltage (OCV).

The connecting of the first unit cell in parallel to the second unit cell may comprise closing main switches of the first and second unit cells, a by-pass switch and a parallel connecting switch between the first and second unit cells, and opening a series connecting switch between the first and second unit cells.

According to another aspect of the present invention, there is provided a method of operating a circuit connection control system of a fuel cell having a plurality of unit cells, comprising: measuring an output voltage of each unit cell; if a first unit cell showing the output voltage lower than a predetermined first voltage is detected in the measuring, determining whether the output voltage of the first unit cell is lower than a predetermined second voltage, the second voltage being lower than the first voltage; connecting the first unit cell in parallel to a second unit cell if the output voltage of the first unit cell is equal to or greater than the second voltage; and electrically separating the first unit cell from other cells if the output voltage of the first unit cell is lower than the second voltage.

The connecting of the first cell in parallel to the second cell may comprise closing main switches of the first and second unit cells, a by-pass switch and a parallel connecting switch between the first and second unit cells, and opening a series connecting switch between the first and second unit cells.

The electrically separating of the first unit cell from other cells may comprise opening a main switch of the first unit cell, a series connecting switch and a parallel connecting switch between the first and second unit cells, and closing a by-pass switch between the first and second unit cells.

Additional aspects and/or advantages of the invention will be set forth in part in the description which follows and, in part, will be obvious from the description, or may be learned by practice of the invention.

BRIEF DESCRIPTION OF THE DRAWINGS

These and/or other aspects and advantages of the invention will become apparent and more readily appreciated from the following description of the embodiments, taken in conjunction with the accompanying drawings of which:

FIGS. 8 and 9 are graphs showing the performance of the monopolar type direct liquid feed fuel cell according to the circuit connection control system of FIGS. 4-7 under conditions in which the first cell CE1 and the sixth cell CE6 are by-passed (electrically separated from CE2-CE4).

FIGS. 10 and 11 are graphs showing the performance of a direct liquid feed fuel cell according to the circuit connection control system of FIGS. 4-7 under conditions in which the first cell CE1 and the sixth cell CE6 are connected in parallel to the remaining cells.

DETAILED DESCRIPTION OF THE EMBODIMENTS

Reference will now be made in detail to the present embodiments of the present invention, examples of which are illustrated in the accompanying drawings, wherein like reference numerals refer to the like elements throughout. The embodiments are described below in order to explain the present invention by referring to the figures.

A circuit connection control system of a fuel cell according to aspects of the present invention and a method of operating the circuit connection control system will now be described with reference to figures.

Figure 1:
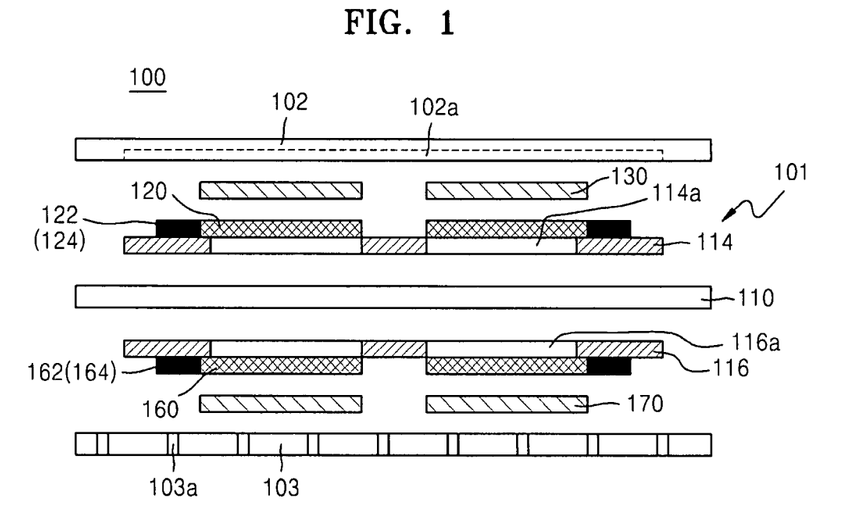
FIG. 1 is a schematic exploded cross-sectional view of a fuel cell to which a circuit connection control system according to an embodiment of the present invention is connected.
Figure 2:
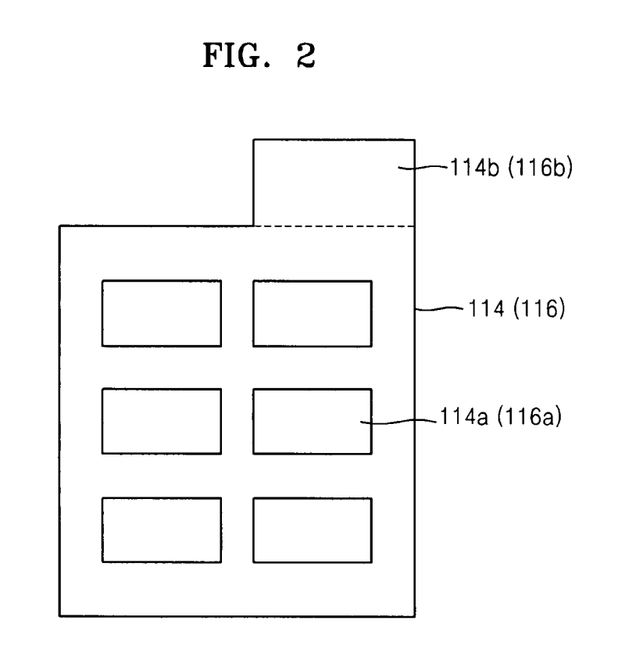
FIG. 2 is a plan view of a supporting body of the fuel cell of FIG. 1.
Figure 3:
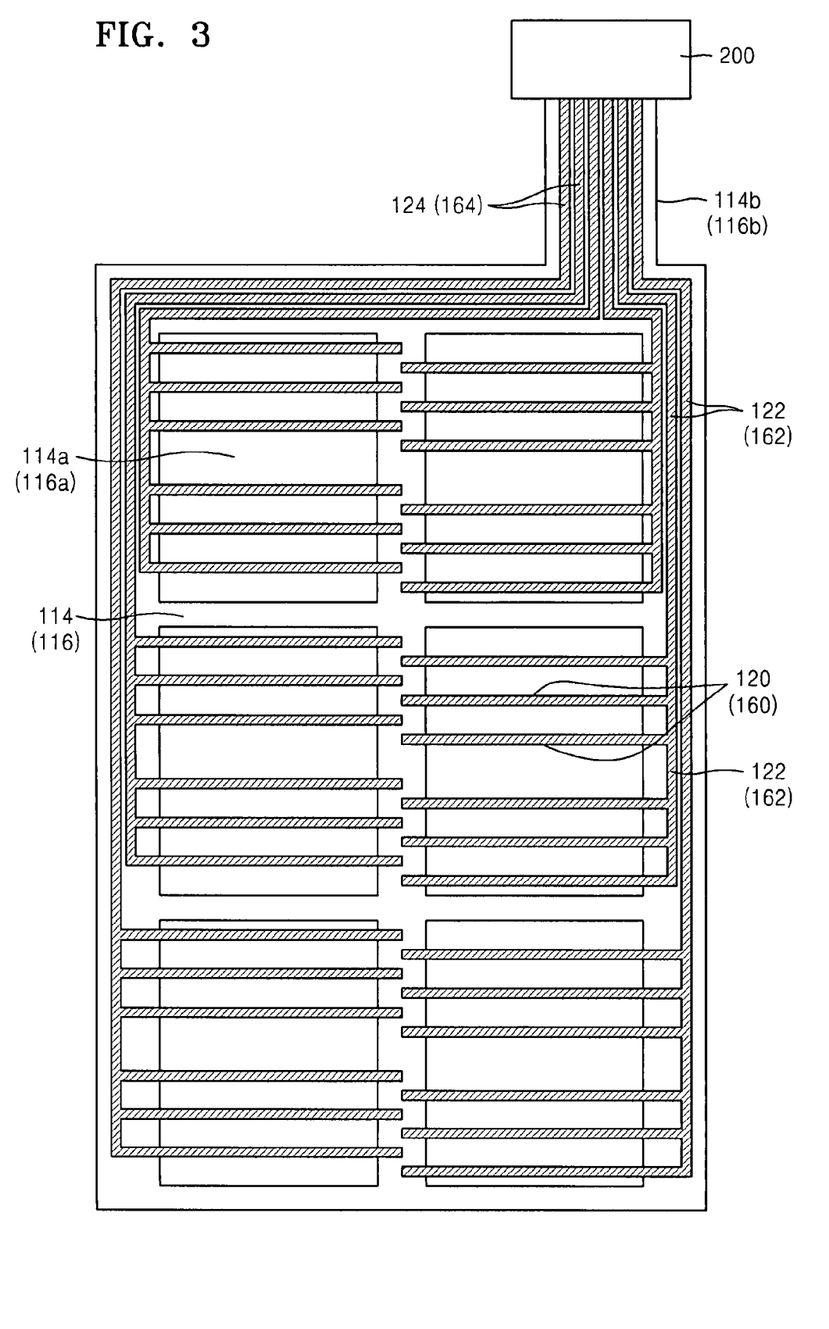
FIG. 3 is a plan view of a current collector of the fuel cell of FIG. 1, in which a current collecting portion, a conducting portion, and a connecting line are integrally formed.

FIG. 1 is a schematic exploded cross-sectional view of a fuel cell to which a circuit connection control system according to an embodiment of the present invention is connected. FIG. 2 is a plan view of a supporting body of FIG. 1. FIG. 3 is a plan view of a current collector in which a current collecting portion, a conducting portion, and a connecting line are integrally formed in one unit.

Referring to FIGS. 1 through 3, a fuel cell 100 includes a monopolar type membrane-electrode assembly 101 in which a current collector is inserted, a monopolar plate 102 having flow channels 102a to supply fuel to an anode electrode 130, and a monopolar plate 103 having air paths 103a for supplying an oxidant (air) to a cathode electrode 170. The monopolar plates 102 and 103 are installed on respective sides of the membrane-electrode assembly 101. The membrane-electrode assembly 101 includes an electrolyte membrane 110 in which a plurality of cell regions, such as, for example, 6 cell regions (first through sixth cell) are formed. Non-conductive supporting bodies 114 and 116, each having a plurality of rectangular openings 114a and 116a corresponding to each cell region, are installed on opposite sides of the electrolyte membrane 110. The supporting bodies 114 and 116 respectively include extension portions 114b and 116b extending outside of the electrolyte membrane 110. Anode current collecting portions 120 and cathode current collecting portions 160 are respectively disposed on the cell regions of the supporting bodies 114 and 116.

Conducting portions 122 are formed at sides of the anode current collecting portions 120. Connecting lines 124 to be electrically connected to the outside and extending from the conducting portions 122 are formed on the extension portion 114b. Conducting portions 162 are formed on sides of the cathode current collecting portions 160, and connecting lines 164 to be connected to the outside and extending from the conducting portion 162 are formed on the extension portion 116b. Anode electrodes 130 are formed on the anode current collecting portions 120, and cathode electrodes 170 are formed on the cathode current collecting portions 160. The connecting lines 124 and 164 are respectively connected to a circuit connection control system 200. The connecting lines 124 and 164 can be easily electrically connected to the circuit connection control system 200 since they are formed together on the extension portions 114b and 116b.

Figure 4:
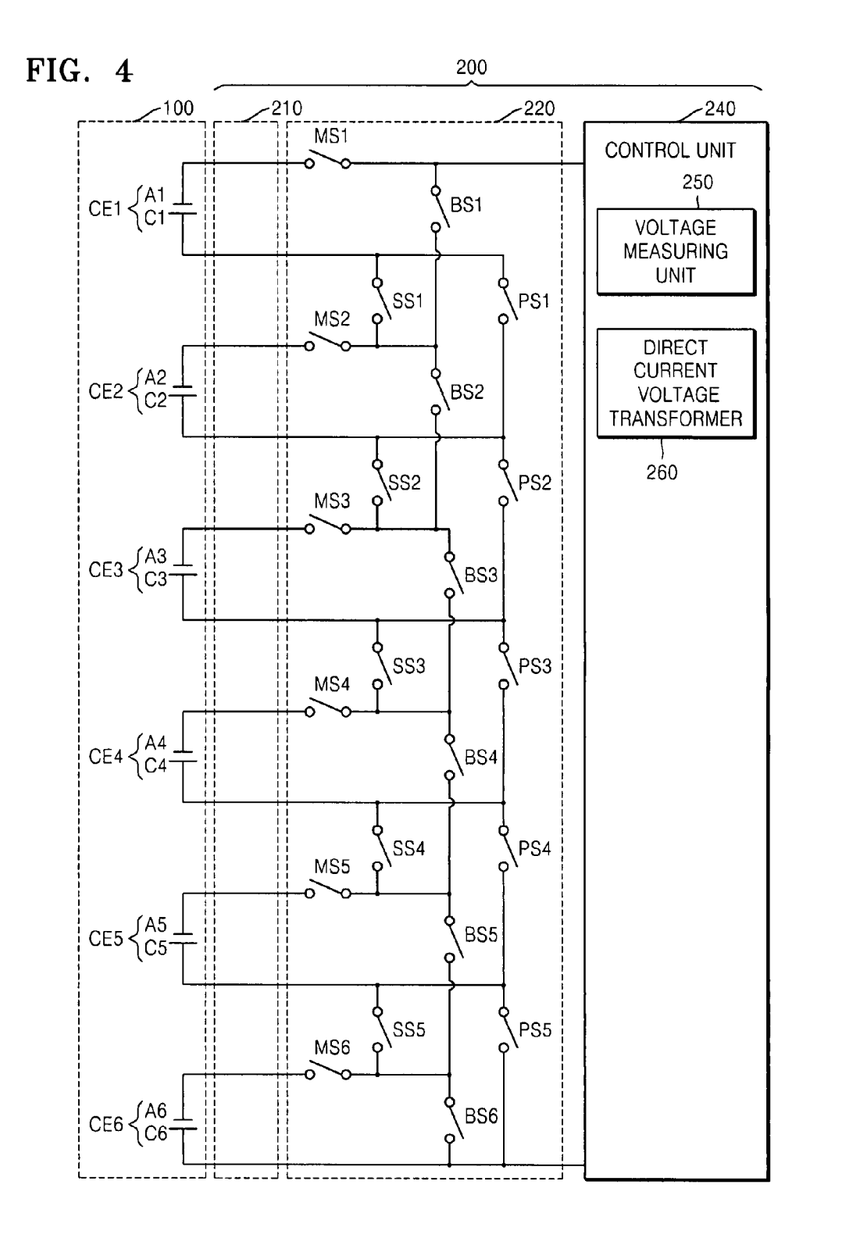
FIG. 4 is a schematic configuration of a circuit connection control system of the fuel cell of FIG. 1.

FIG. 4 is a schematic configuration of a circuit connection control system of a fuel cell according to an embodiment of the present invention. Like reference numerals in FIG. 4 denote the same elements in FIGS. 1 through 3, and thus the descriptions thereof will not be repeated.

The circuit connection control system 200 includes a point connection portion 210 in which anode current collecting portions A1 through A6 and cathode current collecting portions C1 through C6 of unit cells CE1 through CE6 of a fuel cell 100 are electrically directly connected, a switching unit 220 that interconnects connection points of the point connection portion 210, and a control portion 240 that controls the circuit connection control system 200. The control portion 240 includes a voltage measuring unit 250 that measures the voltages of each unit cell and a DC-DC converter that converts a direct current generated from the fuel cell 100 to the direct current voltage required by an electronic device that uses the direct current voltage, and controls a circuitry connection of the switching unit 220.

Although a monopolar type fuel cell 100 having six unit cells is described herein and shown in FIGS. 1-7, it is to be understood that the present invention is not limited to this number or to the shown configuration. Aspects of the present invention can be applied to a fuel cell stack having any number or arrangement of unit cells, such as, for example, a fuel cell stack having dozens of unit cells.

The voltage measuring unit 250 can measure voltages of each of the cells as well as the total voltage of the cells.

The switching unit 220 includes series connecting switches SS1 through SS5 that connect the cells CE1 through CE6 in series, main switches MS1 through MS6 installed at an inlet-end of each cell, by-pass switches BS1 through BS6 that by-pass a current inputted to the main switches MS1 through MS6 to an inlet-end of different cells, and parallel connecting switches PS1 through PS5 that connect a current that has passed one cell to an outlet-end of the next cell. The switches SS1 through SS5, MS1 through MS6, BS1 through BS6, and PS1 through PS5 can be switched using a voltage from the DC-DC converter 260.

Figure 5:
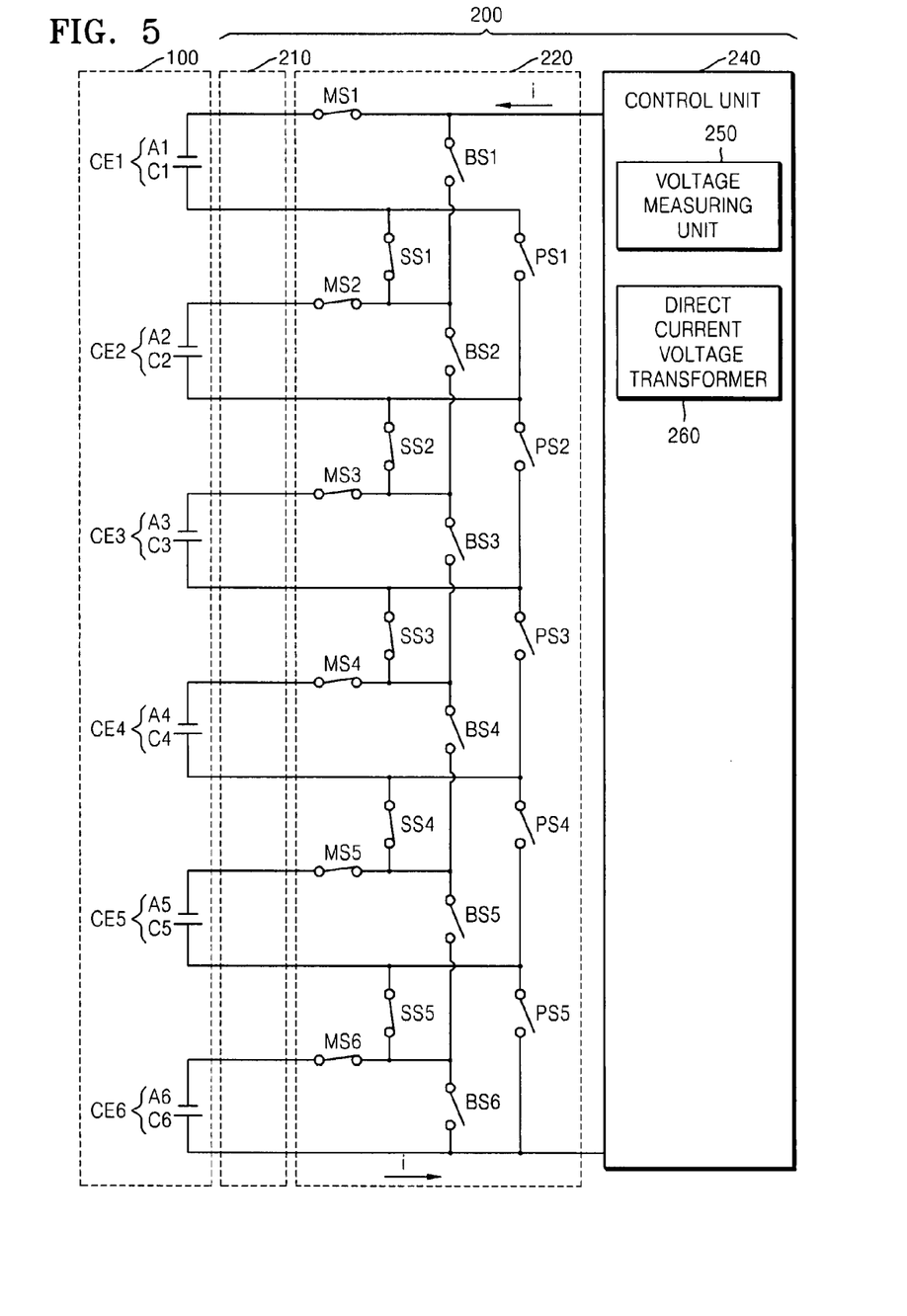
FIG. 5 is a circuit diagram showing a circuit connection when a voltage of each unit cell is normal.

FIG. 5 is a circuit diagram showing a circuit connection when a voltage of each unit cell is normal. Referring to FIG. 5, the main switches MS1 through MS6 and the series connecting switches SS1 through SS5 are closed, and the by-pass switches BS1 through BS6 and the parallel connection switches PS1 through PS5 are open.

Figure 6:
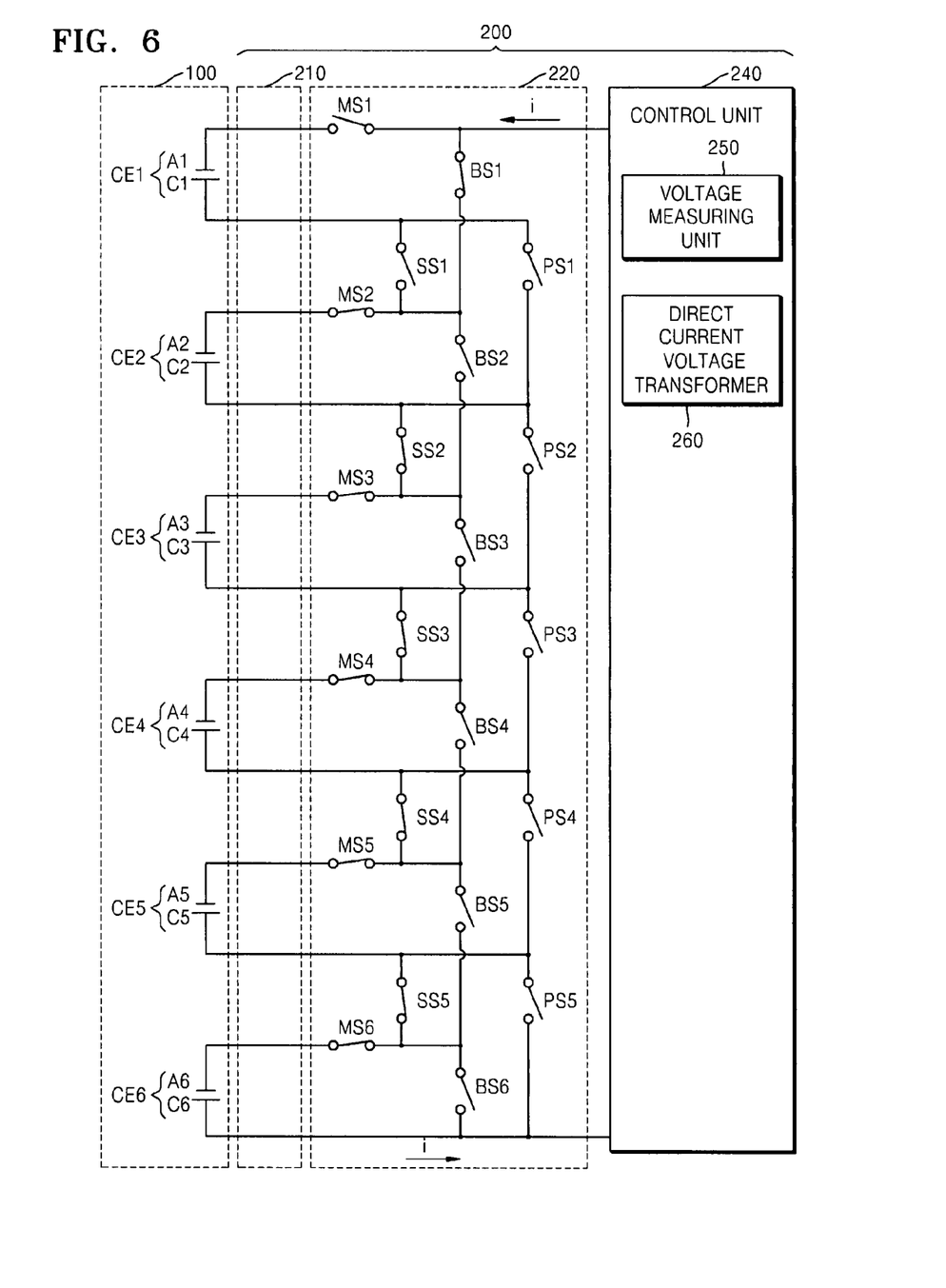
FIG. 6 is a circuit diagram showing a circuit connection in which a first cell CE1 has been electrically separated from a second cell CE2 under a condition in which the first cell CE1 has been performing at a reduced level.

FIG. 6 is a circuit diagram showing a circuit connection in which cell CE1 has been electrically separated from cell CE2 after it has been determined that cell CE1 has been performing at a reduced level. Referring to FIG. 6, the main switch MS1 of cell CE1 and the series connecting switch SS1 between cells CE1 and CE2 are open, and the by-pass switch BS1 between cells CE1 and CE2 is closed. Therefore, a current from the control portion 240 is inputted to cell CE2 and by-passes cell CE1. The cells CE2 through CE6 are connected in series.

Figure 7:
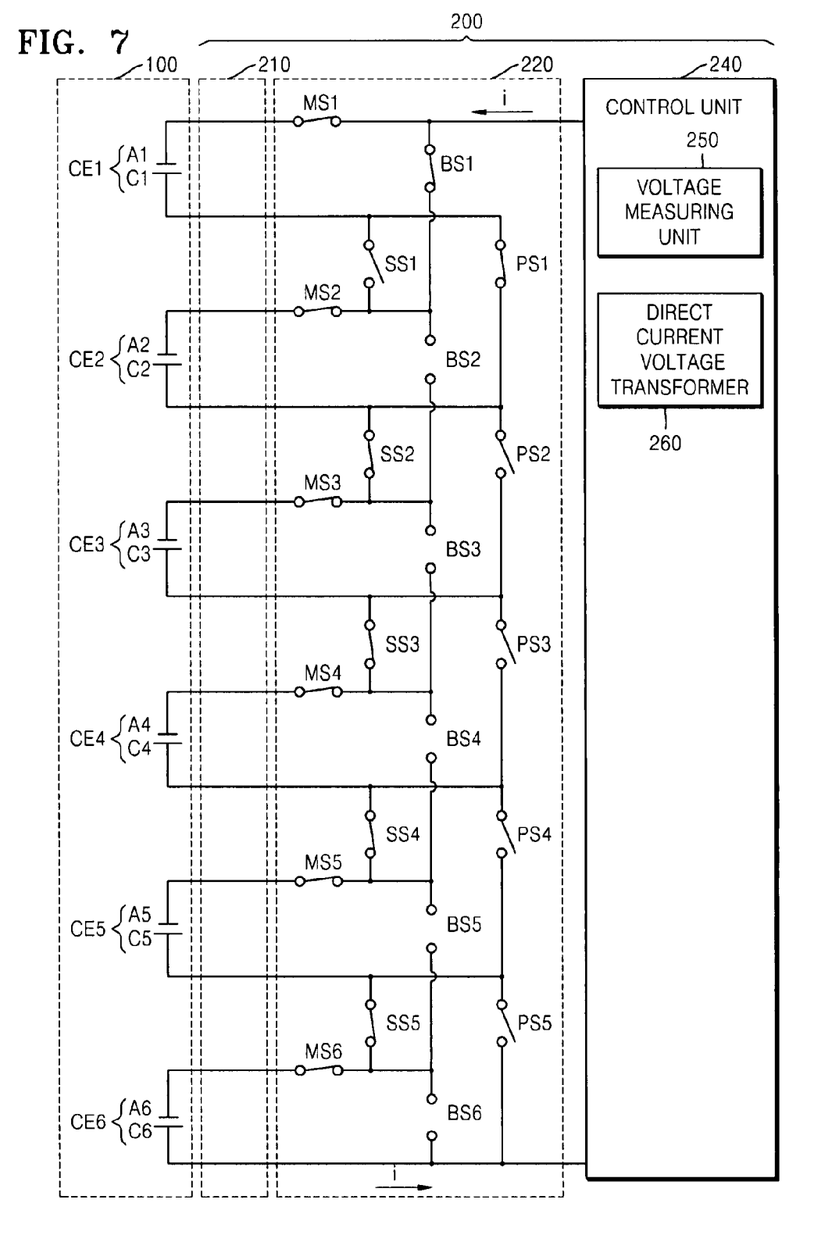
FIG. 7 is a circuit diagram showing a circuit connection in which a first cell CE1 and a second cell CE2 have been connected in parallel under a condition in which the first cell CE1 has been at a reduced level.

FIG. 7 is a circuit diagram showing a circuit connection in which cell CE1 and a CE2 are connected in parallel after it has been determined that cell CE1 has been performing at a reduced level. Referring to FIG. 7, the main switches MS1 and MS2 of cells CE1 and CE2 and a by-pass switch BS1 between the cells CE1 and CE2 are closed so that the anode current collecting portion A1 of cell CE1 and the anode current collecting portion A2 of cell CE2 are connected, and the parallel connecting switch PS1 between cells CE1 and CE2 is closed so that the cathode current collecting portion C1 of cell CE1 and the cathode current collecting portion C2 of cell CE2 are connected. The cells CE2 through CE6 remain connected in series.

A monopolar type direct liquid feed fuel cell was tested under various conditions and configurations as described herein. The fuel cell was a 6 unit cell monopolar type direct liquid fuel cell including a PtRu anode catalyst layer, a Pt cathode catalyst layer and a NAFION (DuPont) membrane. As fuel, 4M MeOH was supplied passively to the anode and ambient air was supplied to the cathode. Apparatus and software for the testing included a data acquisition unit, and electronic load and a LabVIEW monitoring and cell control system.

Figure 8:
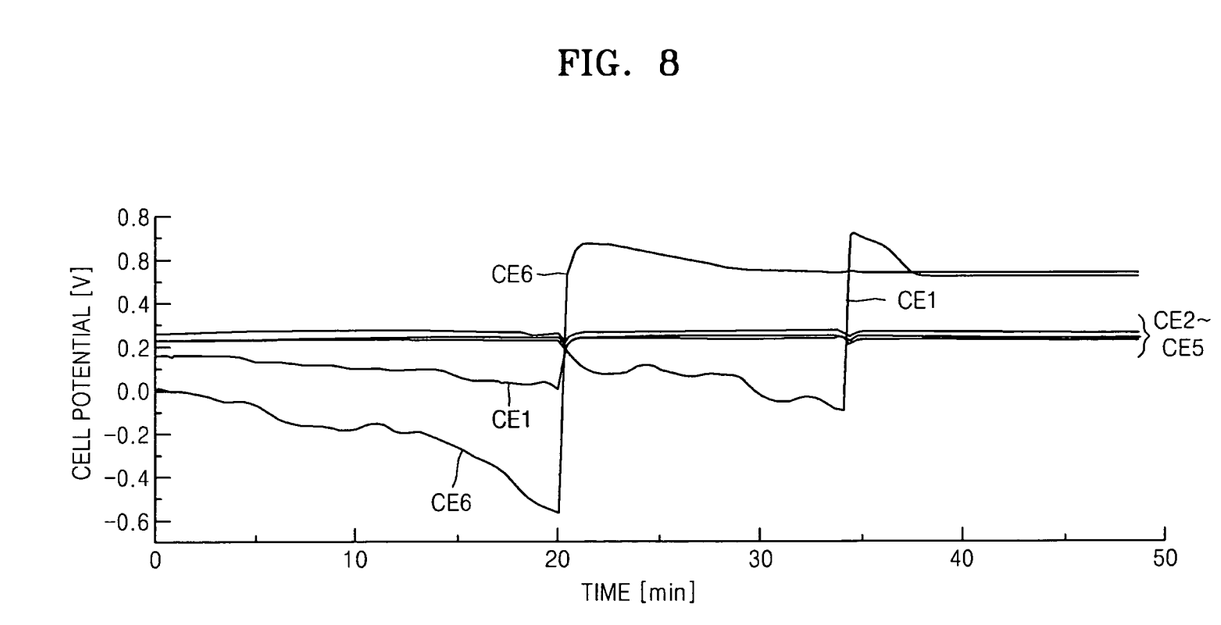
FIG. 8 shows the voltages of the six cells and FIG. 9 shows the total power density of the six cells.
Figure 9:
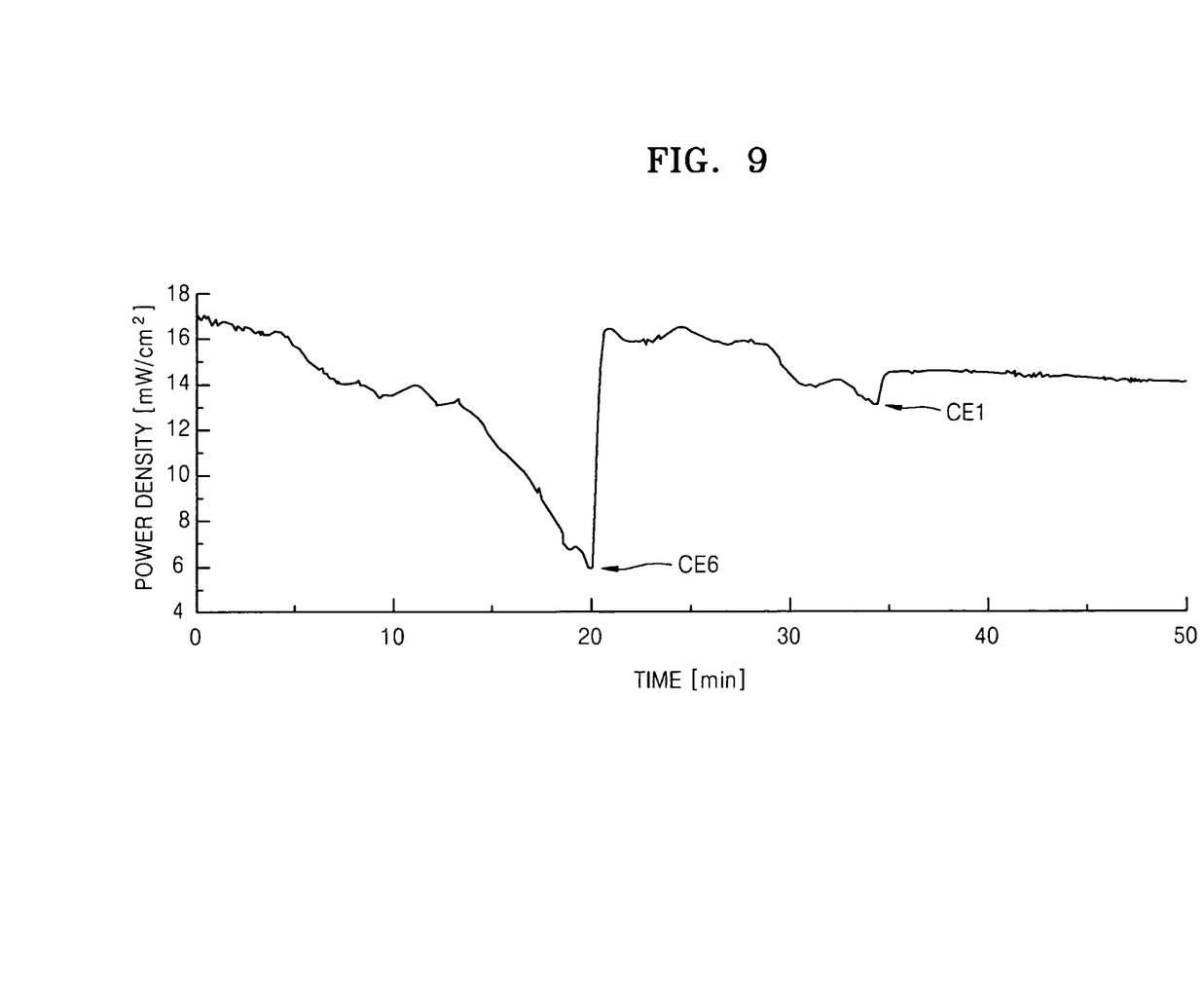

FIGS. 8 and 9 are graphs showing the performance of the monopolar type direct liquid feed fuel cell of FIGS. 1-7, as cells CE1 and CE6 are electrically separated from the other cells. FIG. 8 shows voltages of the six cells and FIG. 9 shows a total power density of the six cells.

When cells CE1 through CE6 are connected in series and if the voltage of cell CE6 becomes low, as detected by the voltage measuring unit 250, the fuel cell cannot function properly due to a low total power density. At this time, when cell CE6 is electrically separated from the other cells using a by-pass switch, the total power density is improved to a certain level. Next, when the voltage of cell CE1 becomes low, the total power density of the fuel cell can be improved by electrically separating cell CE1 from other cells. The cells CE1 and CE6, which are electrically separated from other cells, are operated in an open circuit state, thereby operating at a high voltage.

The use of a circuit connection control system according to an embodiment of the present invention in a fuel cell can easily electrically separate a cell that has a low voltage for some reason, thereby extending the life time of the fuel cell.

Figure 10:
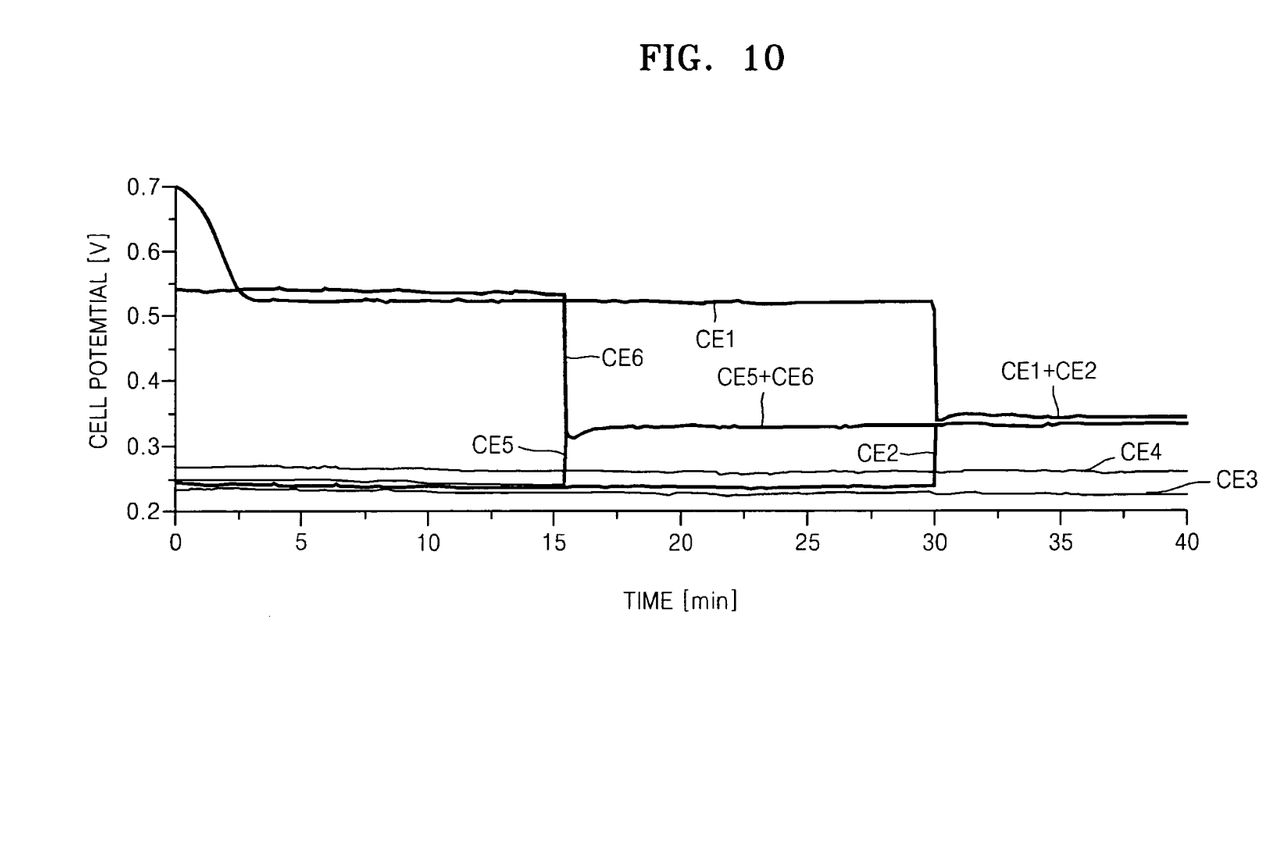
FIG. 10 shows the voltages of the six cells and FIG. 11 shows the total power density of the six cells.
Figure 11:
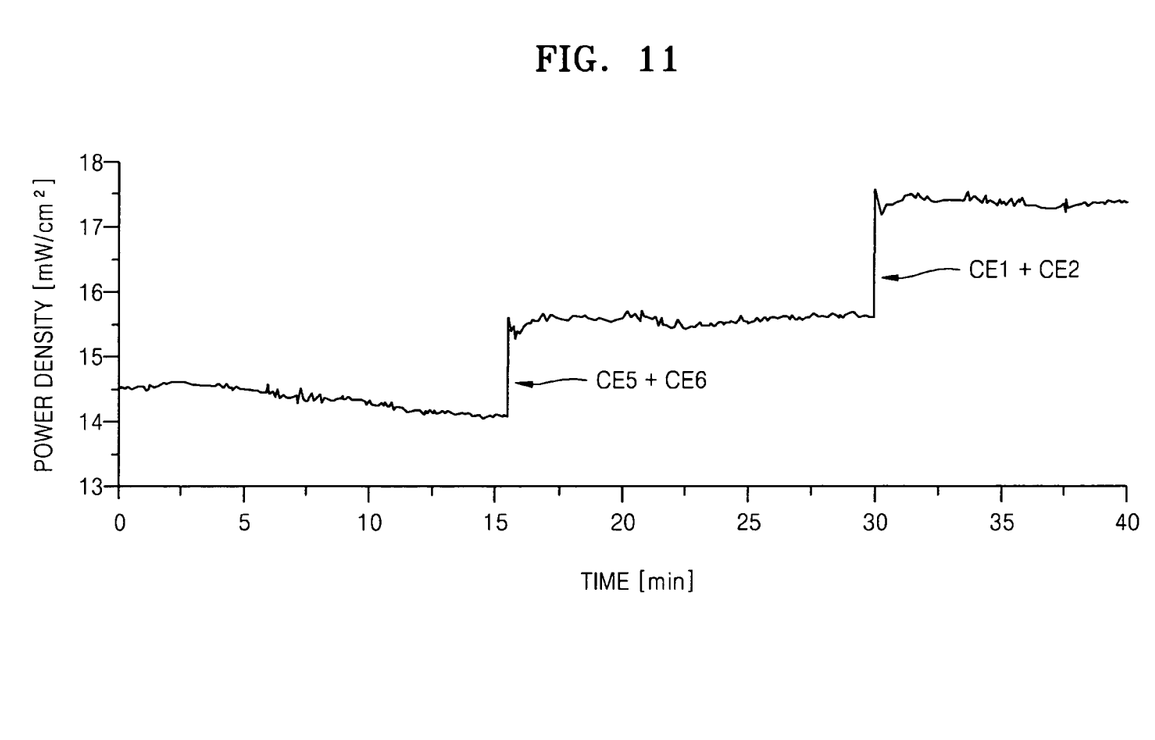

FIGS. 10 and 11 are graphs showing the performance of a direct liquid feed fuel cell according to an embodiment of the present invention, wherein FIG. 10 shows voltages of six cells and FIG. 11 shows the total power density of the six cells. In particular, the graphs of FIGS. 10 and 11 show the performance of the direct liquid feed fuel cell when, after the voltage of cell CE6 becomes low, cell CE6 is connected in parallel to cell CE5 and when, after the voltage of cell CE1 becomes low, cell CE1 is connected in parallel to cell CE2.

As described with reference to FIGS. 8 and 9, when cells CE1 and CE6 are electrically separated from other cells, the open circuit voltage is increased, but the total power density is reduced. However, as shown in FIG. 11, when cell CE5 and cell CE6 are connected in parallel after a voltage decline in CE6, and when cell CE1 and CE2 are connected in parallel after a voltage decline in CE1, the total power density of the fuel cell recovers to a normal level.

A cell performing at a low level can be readily connected to another cell in parallel using a circuit connection control system according to an embodiment of the present invention, thereby increasing the lifetime of the fuel cell.

Figure 12:
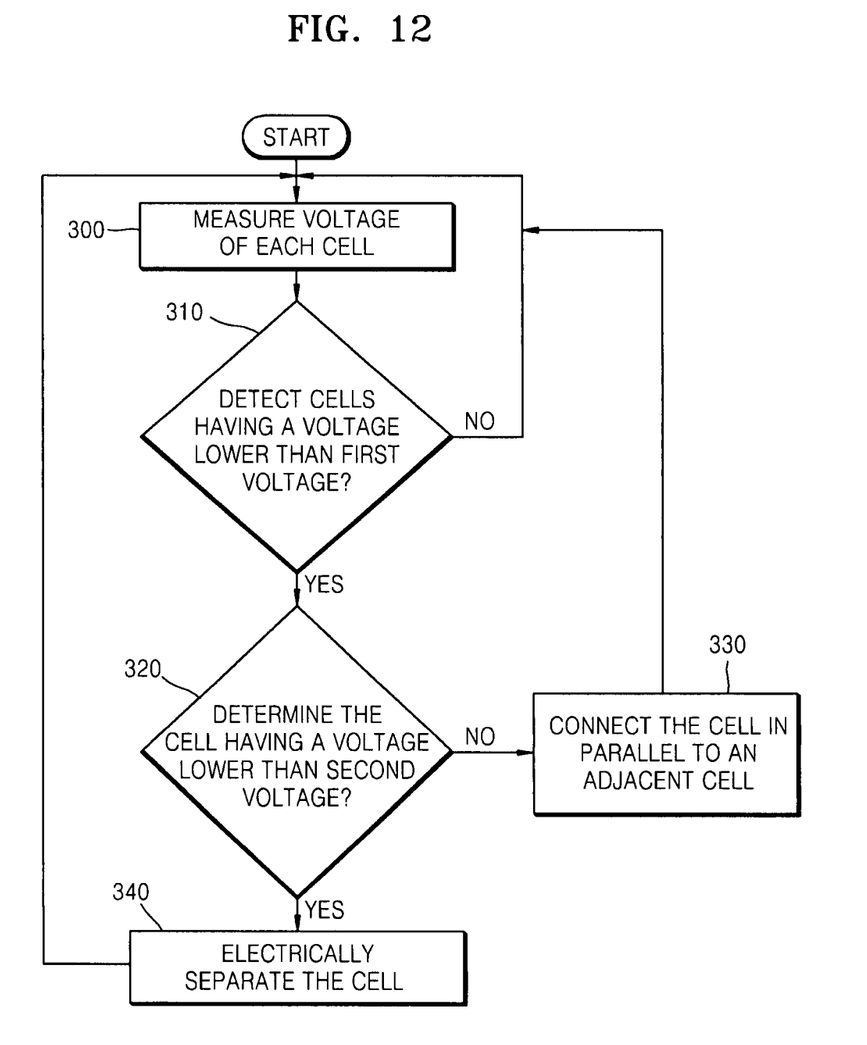
FIG. 12 is a flow chart showing a method of controlling a circuit connection control system according to an embodiment of the present invention.

FIG. 12 is a flow chart showing a method of operating a fuel cell using a circuit connection control system depicted in FIG. 4, according to an embodiment of the present invention.

Each of the cells CE1 through CE6 of the fuel cell are connected in series by closing the main switches MS1 through MS6 and the series connecting switches SS1 through SS5 at the switching unit 220. Voltages of each cell are periodically measured using a voltage measuring unit 250 (operation 300).

The measured voltages are examined to determine whether there is a cell that has a lower voltage than a predetermined first voltage (operation 310). Typically, a voltage of a cell of the fuel cell will be considered to be a normal voltage if it is approximately 30 to 50% of the open circuit voltage (OCV). As an example, the pre-determined first voltage can be set to 10 to 30% of the OCV.

When a cell having a low voltage is detected in operation 310, it is determined whether the measured voltage is lower than a predetermined second voltage (operation 320). The second voltage is lower than the first voltage and as an example, can be set to 10% of the OCV.

If the voltage of the cell having a low voltage is determined to be equal to or greater than the second voltage in operation 320, the cell having a low voltage is connected in parallel to an adjacent cell (operation 330). (For convenience, a cell having a low voltage is referred to herein as a "first" cell so that it can be distinguished from other cells, and a cell adjacent to the cell having a low voltage is referred to as a "second" cell. The terms "first cell" and "second cell" are not intended to be limiting in terms of geometric location or configuration of the cells.) For this purpose, main switches of the first and second cells, a by-pass switch and a parallel connecting switch between the first and second cells, are closed, and a series connecting switch between the first and second cells is opened.

If the voltage of the first cell is determined to be lower than the second voltage in operation 320, the first cell is electrically separated from the second cell (operation 340). For this purpose, the main switch of the first cell and a series switch between the first and second cells are opened, and the by-pass switch between the first and second cells is closed.

Thereafter, if a cell having a low voltage is not detected at the operation 310, or if a cell having a low voltage is detected and operations 330 and 340 are performed, the measuring of the voltage of each cell may be carried out periodically.

When the voltage of a cell that has been electrically separated from other cells due to a low voltage or that has been connected in parallel to an adjacent cell has recovered so that the voltage is higher than the first voltage, the cell can be reconnected in series with the other cells.

Also, at the operation 340, when the number of cells that are electrically separated from other cells exceeds a predetermined number, such as, for example, more than three out of six cells, the operation of the fuel cell may be stopped.

Since the circuit connection control system according to aspects of the present invention is point connected to a monopolar type fuel cell having a plurality of cells, the circuit connection control system can detect a cell having a low voltage and can connect the cell having a low voltage in parallel to an adjacent cell. Therefore, an area of the cells connected in parallel is increased, and accordingly the power density can be increased, thereby increasing the performance of the fuel cell. Also, if a negative voltage is generated from the cell that has a low voltage, the cell that has the low voltage can be separated in circuitry from other cells so that the other, normal cells cannot be affected by the cell that has a low voltage, thereby increasing the lifetime of the fuel cell.

Although a few embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A circuit connection control system of a fuel cell having a plurality of unit cells, the circuit connection control system comprising:
   a point connection portion to which an anode current collecting portion and a cathode current collecting portion of each unit cell are electrically connected;
   a voltage measuring unit that measures an output voltage of each unit cell;
   a switching unit connecting the anode current collecting portions and the cathode current collecting portions of the plurality of unit cells at the point connection portion; and
   a DC-DC converter that converts a voltage generated from the fuel cell to a predetermined voltage,
   wherein the switching unit includes:
      a plurality of main switches, one main switch being installed at an inlet end of each unit cell, the main switches being equal in number to the unit cells;
      a plurality of series connecting switches, each series connecting switch connecting an outlet end of one unit cell of the plurality of unit cells and an inlet end of another unit cell of the plurality of unit cells, one of the main switches being between each series connecting switch and the inlet end of the another unit cell, the series connecting switches being one less in number than the unit cells;
      a plurality of by-pass switches that each connect an inlet end of one unit cell of the plurality of unit cells and an inlet end of another unit cell of the plurality of unit cells, one of the main switches being between each by-pass switch and the inlet end of the another unit cell, the by-pass switches being equal in number to the unit cells; and
      a plurality of parallel connecting switches that each connect an outlet end of one unit cell of the plurality of unit cells and an outlet end of another unit cell of the plurality of unit cells, the parallel switches being one less in number than the unit cells.

2. The circuit connection control system of claim 1, wherein the switching unit connects a first one of the plurality of unit cells and a second one of the plurality of unit cells in parallel by closing the main switches of the first and second unit cells, the by-pass switch and the parallel connecting switch between the first and second unit cells, and by opening the series connecting switch between the first and second unit cells.

3. The circuit connection control system of claim 1, wherein the switching unit electrically separates a first unit cell from a second unit cell by opening the main switch of the first unit cell, the series connecting switch and a parallel connecting switch between the first and second unit cells, and by connecting the by-pass switch between the first and second unit cells.

4. The circuit connection control system of claim 1, further comprising a control portion that connects a first unit cell showing a voltage lower than a predetermined first voltage to a second unit cell and that electrically separates the first unit cell from other unit cells when the voltage of the first unit cell is lower than a predetermined second voltage that is lower than the first voltage.

5. The circuit connection control system of claim 1, wherein the DC-DC converter is connected to the switches of the switching unit and supplies a voltage to operate the switches.

6. A fuel cell, comprising:
   a plurality of unit cells; and
   a circuit connection control system,
   wherein the circuit connection control system includes:
      a point connection portion to which an anode current collecting portion and a cathode current collecting portion of each unit cell are electrically connected;
      a voltage measuring unit that measures an output voltage of each unit cell;
      a switching unit connecting the anode current collecting portions and the cathode current collecting portions of the plurality of cells at the point connection portion; and
      a DC-DC converter that converts a voltage generated from the fuel cell to a predetermined voltage, and wherein the switching unit includes:
- a plurality of main switches, one main switch being installed at an inlet end of each unit cell, the main switches being equal in number to the unit cells;
- a plurality of series connecting switches, each series connecting switch connecting an outlet end of one unit cell of the plurality of unit cells and an inlet end of another unit cell of the plurality of unit cells, one of the main switches being between each series connecting switch and the inlet end of the another unit cell, the series connecting switches being one less in number than the unit cells;
- a plurality of by-pass switches that each connect an inlet end of one unit cell of the plurality of unit cells and an inlet end of another unit cell of the plurality of unit cells, one of the main switches being between each by-pass switch and the inlet end of the another unit cell, the by-pass switches being equal in number to the unit cells; and
- a plurality of parallel connecting switches that each connect an outlet end of one unit cell of the plurality of unit cells and an outlet end of another unit cell of the plurality of unit cells, the parallel switches being one less in number than the unit cells.

7. The fuel cell of claim 6, wherein when the voltage measuring unit determines that an output voltage of a first one of the plurality of unit cells is below a first predetermined limit, the switching unit connects the first unit cell in parallel with a second one of the plurality of unit cells.

8. The fuel cell of claim 7, wherein when the voltage measuring unit determines that the output voltage of the first unit cell is below a second predetermined limit that is lower than the first predetermined limit, the switching unit electrically separates the first unit cell from the others of the plurality of unit cells.

9. The fuel cell of claim 7,
wherein the circuit connection control system measures an output voltage of each unit cell, determines if any of the plurality of unit cells has an output voltage that is lower than a predetermined first voltage and determines if any of the plurality of unit cells has an output voltage that is lower than a predetermined second voltage that is lower than the first voltage, and
wherein, if a first one of the plurality of unit cells has an output voltage that is lower than the predetermined first voltage and equal to or greater than the second predetermined voltage, the circuit connection control system connects the first unit cell to a second one of the plurality of unit cells in parallel and
wherein, if the first unit cell has an output voltage that is lower than the predetermined voltage, the circuit connection control system electrically separates the first unit cell from the other unit cells of the plurality of unit cells of the fuel cell.

10. The fuel cell of claim 9, wherein the fuel cell is a monopolar type fuel cell.

11. A method of operating a circuit connection control system of a fuel cell having a plurality of unit cells, the method comprising:
measuring an output voltage of each unit cell; and
if a first unit cell showing an output voltage lower than a predetermined first voltage is detected in the measuring, connecting the first unit cell in parallel to a second unit cell, wherein the circuit connection control system includes:
- a point connection portion to which an anode current collecting portion and a cathode current collecting portion of each unit cell are electrically connected;
- a voltage measuring unit that measures an output voltage of each unit cell;
- a switching unit connecting the anode current collecting portions and the cathode current collecting portions of the plurality of unit cells at the point connection portion; and
- a DC-DC converter that converts a voltage generated from the fuel cell to a predetermined voltage, and
the switching unit includes:
- a plurality of main switches, one main switch being installed at an inlet end of each unit cell, the main switches being equal in number to the unit cells;
- a plurality of series connecting switches, each series connecting switch connecting an outlet end of one unit cell of the plurality of unit cells and an inlet end of another unit cell of the plurality of unit cells, one of the main switches being between each series connecting switch and the inlet end of the another unit cell, the series connecting switches being one less in number than the unit cells;
- a plurality of by-pass switches that each connect an inlet end of one unit cell of the plurality of unit cells and an inlet end of another unit cell of the plurality of unit cells, one of the main switches being between each by-pass switch and the inlet end of the another unit cell, the by-pass switches being equal in number to the unit cells; and
- a plurality of parallel connecting switches that each connect an outlet end of one unit cell of the plurality of unit cells and an outlet end of another unit cell of the plurality of unit cells, the parallel switches being one less in number than the unit cells.

12. The method of claim 11, wherein the predetermined first voltage is 10 to 30% of an open circuit voltage (OCV).

13. The method of claim 11, wherein the connecting of the first unit cell in parallel to the second unit cell comprises closing the main switches of the first and second unit cells, the by-pass switch and the parallel connecting switch between the first and second unit cells, and opening the series connecting switch between the first and second unit cells.

14. A method of operating a circuit connection control system of a fuel cell having a plurality of unit cells, the method comprising:
measuring an output voltage of each unit cell;
if a first unit cell showing an output voltage lower than a predetermined first voltage is detected in the measuring, determining whether the output voltage of the first unit cell is lower than a predetermined second voltage, the second voltage being lower than the first voltage;
connecting the first unit cell in parallel to a second unit cell if the output voltage of the first unit cell is equal to or greater than the second voltage; and
electrically separating the first unit cell from other unit cells if the output voltage of the first unit cell is lower than the second voltage,
wherein the circuit connection control system includes:
- a point connection portion to which an anode current collecting portion and a cathode current collecting portion of each unit cell are electrically connected;
- a voltage measuring unit that measures an output voltage of each unit cell;

a switching unit connecting the anode current collecting portions and the cathode current collecting portions of the plurality of unit cells at the point connection portion; and a DC-DC converter that converts a voltage generated from the fuel cell to a predetermined voltage, and the switching unit includes:

a plurality of main switches, one main switch being installed at an inlet end of each unit cell, the main switches being equal in number to the unit cells;

a plurality of series connecting switches, each series connecting switch connecting an outlet end of one unit cell of the plurality of unit cells and an inlet end of another unit cell of the plurality of unit cells, one of the main switches being between each series connecting switch and the inlet end of the another unit cell, the series connecting switches being one less in number than the unit cells;

a plurality of by-pass switches that each connect an inlet end of one unit cell of the plurality of unit cells and an inlet end of another unit cell of the plurality of unit cells, one of the main switches being between each by-pass switch and the inlet end of the another unit cell, the by-pass switches being equal in number to the unit cells; and a plurality of parallel connecting switches that each connect an outlet end of one unit cell of the plurality of unit cells and an outlet end of another unit cell of the plurality of unit cells, the parallel switches being one less in number than the unit cells.

15. The method of claim 14, wherein the first voltage is 10 to 30% of an open circuit voltage (OCV).

16. The method of claim 15, wherein the second voltage is less than 10% of the OCV.

17. The method of claim 14, wherein the connecting of the first unit cell in parallel to the second unit cell comprises closing the main switches of the first and second unit cells, the by-pass switch and the parallel connecting switch between the first and second unit cells, and opening the series connecting switch between the first and second unit cells.

18. The method of claim 17, wherein the electrically separating of the first unit cell from other unit cells includes:

opening the main switch of the first unit cell, the series connecting switch and the parallel connecting switch between the first and second unit cells, and closing the by-pass switch between the first and second unit cells.

19. The method of claim 17, wherein the method of operating the circuit connection control system of the fuel cell is repeated periodically during an operation of the fuel cell.

20. The method of claim 19, wherein the operation of the fuel cell is stopped if a proportion of unit cells that are electrically separated from the other unit cells is greater than a predetermined number.

* * * * *